United States Patent
Zmek et al.

(10) Patent No.: US 9,276,034 B2
(45) Date of Patent: Mar. 1, 2016

(54) GRID TOPOGRAPHY FOR PATTERNED SEMICONDUCTOR COATING THAT MINIMIZES OPTICAL SCATTER AND OBSCURATION

(71) Applicant: Goodrich Corporation, Charlotte, NC (US)

(72) Inventors: William Zmek, Bethlehem, CT (US); Mark Louis Ceccorulli, Hamden, CT (US)

(73) Assignee: Goodrich Corporation, Charlotte, NC (US)

( * ) Notice: Subject to any disclaimer, the term of this patent is extended or adjusted under 35 U.S.C. 154(b) by 67 days.

(21) Appl. No.: 14/246,219

(22) Filed: Apr. 7, 2014

(65) Prior Publication Data

US 2015/0289424 A1    Oct. 8, 2015

(51) Int. Cl.
*H01L 27/00* (2006.01)
*H01L 27/146* (2006.01)
*H05K 9/00* (2006.01)

(52) U.S. Cl.
CPC ...... *H01L 27/14685* (2013.01); *H01L 27/1462* (2013.01); *H01L 27/14601* (2013.01); *H01L 27/14698* (2013.01); *H05K 9/0094* (2013.01)

(58) Field of Classification Search
CPC .......... G06F 3/044; G06F 2203/04103; H01L 27/14601; H01L 27/1462; H01L 27/14685
See application file for complete search history.

(56) References Cited

U.S. PATENT DOCUMENTS

| | | | |
|---|---|---|---|
| 7,496,241 B1 | 2/2009 | Reneker et al. | |
| 7,579,939 B2 | 8/2009 | Schofield et al. | |
| 7,864,120 B2 | 1/2011 | Dou et al. | |
| 8,044,776 B2 | 10/2011 | Schofield et al. | |
| 8,155,433 B2 | 4/2012 | Chien | |
| 8,406,513 B2 | 3/2013 | Chien | |
| 8,558,890 B2 | 10/2013 | Mrozek et al. | |
| 8,610,992 B2 | 12/2013 | Varaprasad et al. | |
| 8,630,040 B2 | 1/2014 | Bright et al. | |
| 8,643,064 B2 | 2/2014 | Tian et al. | |
| 2015/0220183 A1* | 8/2015 | Youngs et al. | |

* cited by examiner

*Primary Examiner* — Tony Ko
(74) *Attorney, Agent, or Firm* — Carlson, Gaskey & Olds, PC

(57) ABSTRACT

A surveillance device includes an electronic component and a protective surface outwardly of the electronic component. A generally transparent substrate is formed from a first material. Spaced portions of an electrically conductive coating are formed within channels in the substrate. The electrically conductive material is a semiconductor material. A method is also disclosed.

16 Claims, 2 Drawing Sheets

GRID TOPOGRAPHY FOR PATTERNED SEMICONDUCTOR COATING THAT MINIMIZES OPTICAL SCATTER AND OBSCURATION

BACKGROUND OF THE INVENTION

This application relates to a patterned electromagnetic interference shielding coating applied to the exterior surface of a protective optical element. The coating consists of an electromagnetic interference shielding feature which is placed in channels in a substrate surface, and which is typically formed of a semiconductor.

Transparent protective optical elements are utilized in a number of applications. One application is to protect an image capturing device. The image capturing device may be a camera associated with an aircraft such as a surveillance vehicle. The surveillance vehicle may attempt to capture images over a wide spectrum of wavelengths. Another application is to protect a beam delivery device such as a laser communication system or a laser targeting system.

It is important to shield or block electromagnetic interference (EMI) from harming the electronics contained within such systems.

Three ways of blocking the EMI are known.

In the first, the material chosen for the substrate is conductive and therefore will itself block EMI. Such substrates typically do not transmit visible radiation and therefore are limited to infrared applications.

A second method is to provide a grid of metal as a coating on the exterior surface of the substrate. Because of the voids present in the grid metal, these coatings are transparent to light of any wavelength out to long-wavelength infrared, and therefore as prior art are preferred for applications requiring the widest range of wavelength band transmission.

In a third method, an electrically conductive coating is placed on the outer surface of the substrate and is formed of a semiconductor material that is relatively transparent to visible and near-infrared light. However, the semiconductor coating transparency is zero at potentially critical longer wavelengths.

In wavelengths that cannot be transmitted through the coating, there is no ability to capture any image.

It has been proposed to embed metal mesh within a surface of the substrate. This does not address the concerns mentioned above.

SUMMARY OF THE INVENTION

A surveillance device includes an electronic component and a protective surface outwardly of the electronic component. A generally transparent substrate is formed from a first material. Spaced portions of an electrically conductive coating are formed within channels in the substrate. The electrically conductive material is a semiconductor material. A method is also disclosed.

These and other features may be best understood from the following drawings and specification.

DETAILED DESCRIPTION

In prior art, coatings designed to provide EM shielding have been formed either of patterned metal such as a grid, or of a continuous semiconductor thin-film layer, which by proper material choice can be made transparent to visible light and near infrared light. Each of these two forms has serious detractions. The metal grid is transparent to radiation from the EUV to long-wavelength infrared due to the presence of the voids between the grid "wires" or strips. Nevertheless, it causes serious disruption of a transmitted optical beam, both by obscuration and by scattering of light. In contrast, the continuous semiconductor layer lacks the patterning that disrupts transmitted beams, but cannot transmit optical radiation having wavelengths longer than the near infrared, due to semiconductor material limitations. Thus, the prior art imposes a hard design trade-off: a designer needing broadband transmission must live with the imposed optical problems imposed by a grid pattern, whereas a designer that cannot live with the optical problems of the grid, can avoid them by using the semiconductor coating, but will have to live with severely reduced wavelength bandwidth.

This application disclosure allows the fabrication of an EM-protective coating that avoids or minimizes the either-or trade imposed by the above prior art. The invention is a hybrid of the two prior-art approaches. Instead of metal, a patterned grid-like coating is made of an optically transparent semiconductor material. In embodiments, a designer may match the index of refraction of the patterned semiconductor to the substrate, and may choose special topography of the patterned semiconductor. The semiconductor material is placed in channels that have been produced in the exterior surface of the optical substrate of a protective element, such that the semiconductor is flush with, or close to, the substrate optical surface. The performance deficiencies inherent in a metal grid can be minimized in the visible and near-IR spectral regions, while allowing optical transmission in the longer-wavelength regions that are blocked by the prior art unpatterned semiconductor coating.

Figure 1:
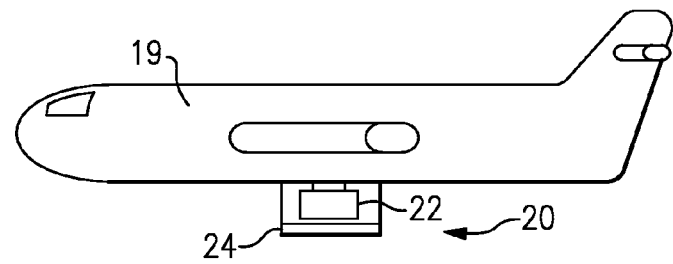
FIG. 1 schematically shows an image capture device.
Figure 1:
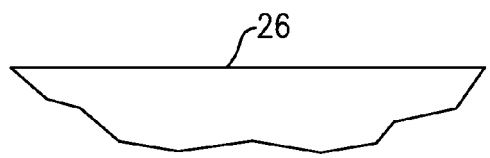

FIG. 1 shows an aircraft 19 having an image capture assembly 20. An image capture device 22, such as a camera, is provided behind a protective optical element, typically a window assembly 24. The image capture device 22 is intended to capture images from the surface 26 spaced from the aircraft 19.

While a camera is disclosed, it should be understood the image capture device could be some other electro-optical system, such as a laser communication or targeting system.

As mentioned above, the image capture device 22 must be shielded from electromagnetic interference. However, the known methods each have deficiencies.

Figure 2A:
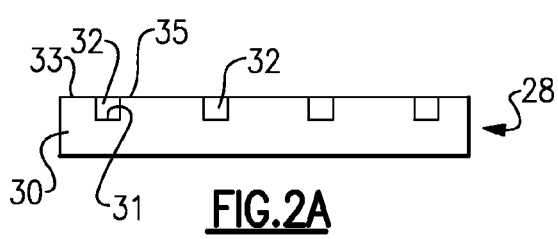
FIG. 2A shows a substrate.

FIG. 2A shows an embodiment 28 wherein a substrate 30, which is a generally transparent material, is provided with a grid pattern of a coating shown at 32. Coating 32 is provided by semiconductor material. The semiconductor material is deposited into etched grooves or channels 31 in the substrate 30 and such that a top surface 33 of the substrate is generally even or coincident with a top surface 35 of the semiconductor coating 32. In embodiments, if the etched channel is chosen to have a rectangular cross section, the vertical distance between the top surface 33 and the top surface 35 may vary from perfectly flush in order to optimize performance. This difference may be on the order of a micron or less.

The etched channel can have a V-shaped cross section, a round cross section, or a parallelogram cross section; others are possible and may be preferable for certain applications.

Figure 2B:
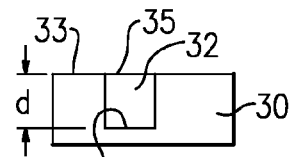
FIG. 2B shows a detail of the substrate.

As shown in FIG. 2B, a depth d of the coating 32 (and channel 31) is illustrated. In embodiments, the depth d will range from perhaps 20 microns to as little as one micron, depending on the application and on the specific EMI requirements.

Figure 2C:
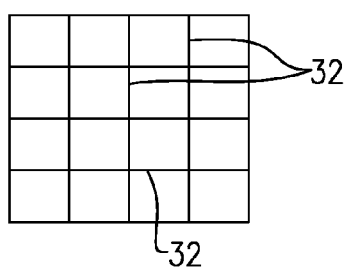
FIG. 2C shows yet another detail.

FIG. 2C shows crossing portions of the electrically conductive coating 32, which generally form a grid or mesh.

In embodiments, a ratio of the indices of refraction of the coating material and the substrate material at a wavelength of 1000 nm is between 0.8 and 1.25.

Figure 2D:
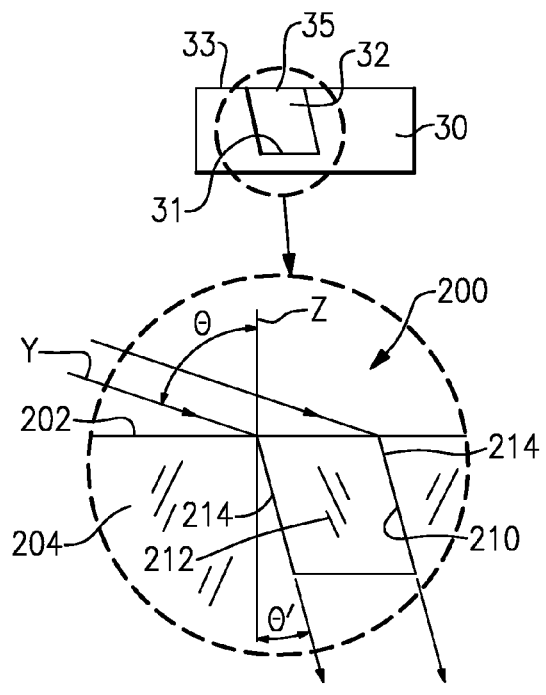
FIG. 2D shows another detail of the substrate.

FIG. 2D shows an embodiment 200, wherein a top surface 202 of the protective element 204 has a normal direction Z. An etched channel 210 receives semiconductor materials 212, as described above. Sides 214 of the channel are formed at an angle Θ' relative to the normal Z. Incident rays from an image to be captured extend along a direction Y. Direction Y is spaced from the normal Z by an angle Θ. The angle Θ' may be selected based upon Snell's Law, which states:

Θ'=ASIN (sin of Θ/n), wherein n is the index of refraction of the material of substrate 204.

Thus, the channel may have sides selected to extend at an angle which is non-parallel to a normal of a top surface of the substrate, and wherein the angle is selected dependent upon an incident angle of a beam to be captured, and further an index of refraction of the substrate.

The parallelogram cross-section channel 210 maximizes the amount of semiconductor filling the channel while minimizing scattered light for beams arriving at a finite angle of incidence. An angle of slant of the parallelogram can be fashioned to equal the angle of the incident beam from a scene to be observed, relative to the surface normal, after refraction into the substrate. The beam, after entering the substrate, passes unscattered through the length of the semiconductor material.

As shown in FIG. 2B, a depth d of the coating 32 (and channel 31) is illustrated. In embodiments, the depth d will range from perhaps 20 microns to as little as one micron, depending on the application and on the specific EMI requirements.

The material for the electrically conductive coating is a semiconductor material. Indium tin oxide materials may be utilized. However, other semiconductor materials having appropriate optical transmission and index of refraction, and electrical conduction properties, would come within the scope of this application.

The indium tin oxide coating transmits effectively from the visible range out to perhaps 1.5 micron wavelengths. Beyond 2 microns, such coatings become generally opaque. Thus, when using such coatings, the prior art problem mentioned above occurs when trying to capture images or portions of the image in those wavelengths.

However, since the coating 32 of this disclosure is only present over limited portions of an image plane, this will only slightly limit the captured image. In embodiments, the coating may cover as little as 1% to as much as 25% of the surface area of the substrate.

In addition, materials for the substrate 30 and the electrically conductive coating 32 are selected such that they have an index of refraction which is relatively close, at least across a band of wavelengths. As an example, if indium tin oxide material is utilized, the index of refraction extends from approximately 2.0 at 500 nm to approximately 1.7 at 1000 nm.

The substrate material may be ALON® optical ceramic material, which has an index of refraction of about 1.8-1.7 across a similar band (400 nm to 1000 nm). Spinel may also be utilized for the substrate and has an index of refraction of about 1.74-1.70. Alternatively, sapphire materials may be utilized and have an index of refraction of about 1.83 to about 1.75. Further, zinc sulfide materials may be utilized having an index of refraction of about 2.55 to about 2.29. The transmission and scatter performance of a semiconductor grid embedded in a zinc sulphide substrate in accordance with this application will be reduced relative to the aforementioned materials, but nevertheless will be superior to a metal grid of equal area coverage.

In general, the semiconductor materials and the substrate material are selected such that a ratio of their respective indices of refraction at a sensor-user's preferred wavelength within the visible to near-IR band is equal to 1. However, due to the lack of a wide range of available substrate materials that would have allowed such a choice, generally the ratio at the preferred wavelength will not be exactly 1. Small departures from a ratio of indices of 1 reduce the benefits of the invention somewhat, but nevertheless will still result in improved performance over the visible/near-IR band relative to a metal grid. For example, a ratio of as much as 1.1 or more will still result in a significant reduction of scattered light relative to a metal grid, and will allow more light through to a sensor. Note that the chosen depth of the channel has an effect on this performance improvement as well. For normal incidence and a rectangular cross section channel, the amount of scattered light will be zero for an index fraction of 1, and at the worst case depth of channel, rises to about half that of the metal grid for an index ratio of 1.05.) That is, the indices should be close to each other in order to gain the advantages offered by the invention, but if the indices are not identical, then the benefits of the invention become somewhat reduced.

Figure 2E:
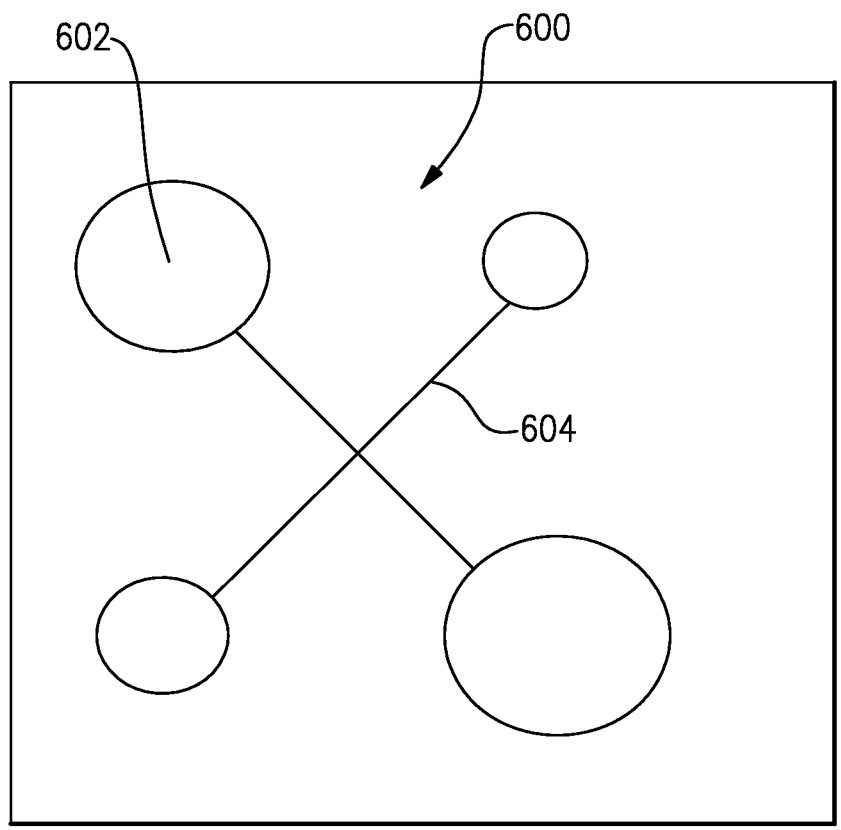
FIG. 2E shows another alternative.

As shown in FIG. 2E, the grid of FIG. 2C is simply one example. Any number of other shapes can be utilized. In fact, a grid such as shown at 600 including a plurality of circles 602 connected by line 604 may be the actual example.

Figure 3:
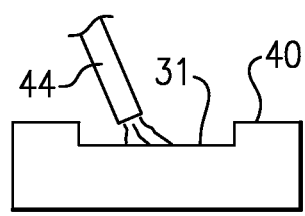
FIG. 3 shows one method of forming the channels in a substrate that will receive conductive material.

FIG. 3 shows a method of forming the protective member 20. Channels 31 are etched into the substrate 40 and a tool 44 is shown selectively depositing the electrically conductive coating into the channel.

The etching process may be adjusted so that the etched channels take on a slant angle relative to the surface of the substrate, per FIG. 2D. The angle preferably equals the angle that a refracted ray makes inside the substrate (having arrived at a certain non-zero angle of incidence dictated by certain end-use system applications), the scattered light caused by any index of refraction differences between the substrate and the semiconductor filling the channel will be zero from the walls of the etched channel, effectively minimizing the total amount of scattered light from the grid. Note that if the index of refraction of the substrate and semiconductor grid are identical for all wavelengths of interest, the scattered light will be identically zero over the wavelength band of transmission of the semiconductor.

Thus, the disclosed protective optical element provides the benefits of the protective coating that allows passage of image information across a wide band of wavelengths, and still provides EMI shielding, in the same fashion as a metal grid for mid-wave and longer infrared wavelengths which are blocked by the protective coating. For wavelengths within the transmission band of the semiconductor grid such as the critical visible and near-infrared band of wavelengths, the invention behaves more like a continuous, un-gridded optical element, with reduced optical scatter and enhanced optical transmission.

While the protective element is shown separate from the electro-optical system, it should be understood that the protective element could be embedded in an outer surface of a lens of the electro-optical system, provided requirements of the electro-optical system allow the outer lens to serve as a protective element which faces the exterior environment.

Although an embodiment of this invention has been disclosed, a worker of ordinary skill in this art would recognize that certain modifications would come within the scope of this invention. For that reason, the following claims should be studied to determine the true scope and content of this invention.

The invention claimed is:

1. An optical system comprising:
an electro-optical system and a protective optical element outwardly of said system, said protective optical element is a generally transparent substrate formed from a first material, and spaced portions of an electrically conductive coating formed within channels in said substrate, said electrically conductive material being a semiconductor material, wherein said electro-optical system is an image capture device.

2. The system as set forth in claim 1, wherein said coating is provided in the substrate in a grid of crossing channels.

3. The system as set forth in claim 2, wherein said semiconductor material can be an indium tin oxide material.

4. The system as set forth in claim 3, wherein a depth of said electrically conductive coating is less than 20 microns.

5. The system as set forth in claim 4, wherein an exterior face of the substrate and the exterior face of the coating are generally co-incident such that the two faces are spaced by less than a small fraction of a wavelength of visible light.

6. The system as set forth in claim 1, wherein an exterior face of the substrate and an exterior face of the coating are generally co-incident such that the two faces are spaced by less than one micron.

7. The system as set forth in claim 1, wherein said semiconductor material can be an indium tin oxide material.

8. The system as set forth in claim 1, wherein a depth of said electrically conductive coating is less than 20 microns.

9. The system as set forth in claim 1, wherein a ratio of the indices of refraction of the coating material and the first material at 1000 nm is between 0.8 and 1.25.

10. The system as set forth in claim 1, wherein said channels have sides which extend to be non-parallel to a normal direction relative to an exterior face of said substrate, and with said angle being selected dependent upon an index of refraction of the substrate, and an incident ray angle of a beam approaching the substrate.

11. The optical system as set forth in claim 1, wherein said image capture device is one of a camera, laser communication, or a targeting system.

12. A method of forming a protective surface to be positioned outwardly of an electronic component comprising the steps of:
providing a generally transparent substrate from a first material, and forming channels in said substrate; and
depositing an electrically conductive coating within the channels in said substrate, said electrically conductive material being a semiconductor material, and an exterior face of the substrate and an exterior face of the coating are generally formed to be co-incident such that the two faces are spaced by less than 1 micron.

13. The method as set forth in claim 12, wherein said electrically conductive coating is provided in the substrate in a grid of crossing channels.

14. The method as set forth in claim 12, wherein said semiconductor material is an indium tin oxide material.

15. The method as set forth in claim 12, wherein a depth of said electrically conductive coating and said channel is less than 20 microns.

16. An optical system comprising:
an electro-optical system and a protective optical element outwardly of said system, said protective optical element is a generally transparent substrate formed from a first material, and spaced portions of an electrically conductive coating formed within channels in said substrate, said electrically conductive material being a semiconductor material, wherein an exterior face of the substrate and an exterior face of the coating are generally co-incident such that the two faces are spaced by less than one micron.

* * * * *